(12) United States Patent
Pavlicek et al.

(10) Patent No.: US 12,733,493 B2
(45) Date of Patent: Sep. 8, 2026

(54) POWER SEMICONDUCTOR DEVICE AND MANUFACTURING METHOD

(71) Applicant: Hitachi Energy Ltd, Zürich (CH)

(72) Inventors: Niko Pavlicek, Zürich (CH); Dominik Truessel, Bremgarten (CH); Milad Maleki, Untersiggenthal (CH); Lluis Santolaria, Olten (CH)

(73) Assignee: HITACHI ENERGY LTD, Zürich (CH)

( * ) Notice: Subject to any disclaimer, the term of this patent is extended or adjusted under 35 U.S.C. 154(b) by 428 days.

(21) Appl. No.: 18/277,208

(22) PCT Filed: Jan. 19, 2022

(86) PCT No.: PCT/EP2022/051078
§ 371 (c)(1),
(2) Date: Aug. 14, 2023

(87) PCT Pub. No.: WO2022/179770
PCT Pub. Date: Sep. 1, 2022

(65) Prior Publication Data

US 2024/0145332 A1 May 2, 2024

(30) Foreign Application Priority Data

Feb. 24, 2021 (EP) .................................... 21159002

(51) Int. Cl.
*H10W 40/22* (2026.01)
*H10W 70/40* (2026.01)
(Continued)

(52) U.S. Cl.
CPC ....... *H10W 40/226* (2026.01); *H10W 70/415* (2026.01); *H10W 70/467* (2026.01);
(Continued)

(58) Field of Classification Search
None
See application file for complete search history.

(56) References Cited

U.S. PATENT DOCUMENTS

| | | | |
|---|---|---|---|
| 5,105,259 | A | 4/1992 | Mcshane |
| 2005/0082690 | A1 | 4/2005 | Hayashi et al. |

(Continued)

FOREIGN PATENT DOCUMENTS

| | | | |
|---|---|---|---|
| CN | 110785838 | A | 2/2020 |
| EP | 0577966 | A1 | 1/1994 |

(Continued)

OTHER PUBLICATIONS

Bellu et al., "Enhanced Module Design with DPD Technology", PCIM Europe 2018, Nuremberg, Germany, ISBN 978-3-8007-4646-0, pp. 588-592.

*Primary Examiner* — Dale E Page
*Assistant Examiner* — Derek L Nielsen
(74) *Attorney, Agent, or Firm* — PROCOPIO, CORY, HARGREAVES & SAVITCH LLP

(57) ABSTRACT

In at least one embodiment, the power semiconductor device (1) comprises:

Figure 1:
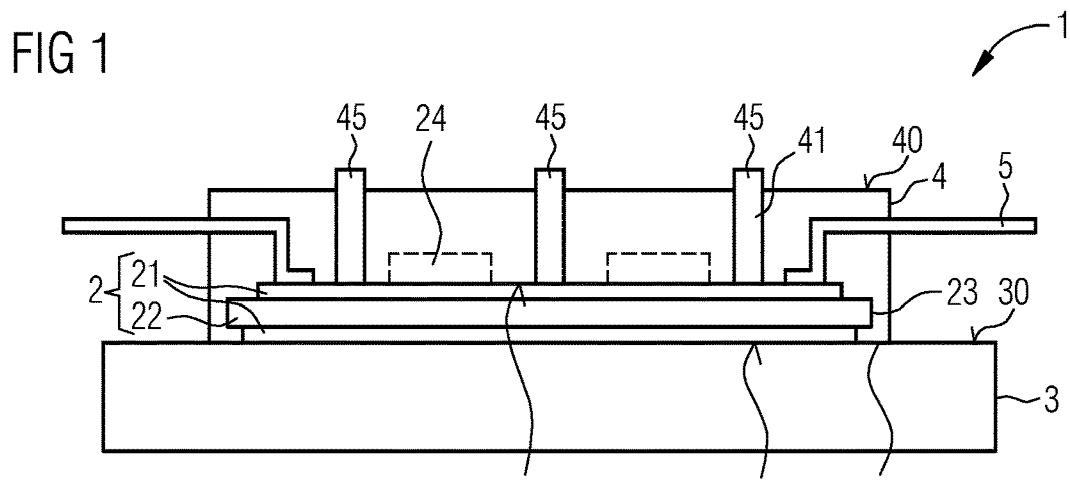

at least one support (2), at least one power semiconductor chip (24) is arranged on a support top side (20), a heat sink (3) having a heat sink top side (30), the at least one support (2) is arranged on the heat sink top side (30), and a mold body (4) of an electric insulating material in direct contact with the at least one support (2) and the heat sink (3), wherein the mold body (4) fixes and presses the at least one support (2) onto the heat sink (3).

20 Claims, 3 Drawing Sheets

(51) Int. Cl.

| | |
|---|---|
| ***H10W 72/30*** | (2026.01) |
| ***H10W 72/50*** | (2026.01) |
| ***H10W 74/00*** | (2026.01) |
| ***H10W 90/00*** | (2026.01) |

(52) U.S. Cl.

CPC .......... *H10W 90/00* (2026.01); *H10W 72/321* (2026.01); *H10W 72/344* (2026.01); *H10W 72/521* (2026.01); *H10W 72/541* (2026.01); *H10W 74/00* (2026.01)

(56) References Cited

U.S. PATENT DOCUMENTS

| | | | | |
|---|---|---|---|---|
| 2007/0275504 | A1* | 11/2007 | Kishimoto .......... | H10W 74/012<br>257/E21.503 |
| 2014/0332951 | A1 | 11/2014 | Nakamura et al. | |
| 2015/0014867 | A1* | 1/2015 | Tsukurimichi ...... | H10W 74/473<br>257/791 |
| 2015/0137344 | A1* | 5/2015 | Mori .................... | H10W 40/10<br>438/122 |
| 2018/0114740 | A1 | 4/2018 | Liu et al. | |
| 2020/0027814 | A1 | 1/2020 | Ichiryu et al. | |
| 2020/0066609 | A1* | 2/2020 | Mohn ................ | H10W 74/114 |
| 2020/0303215 | A1 | 9/2020 | Ichikawa | |

FOREIGN PATENT DOCUMENTS

| | | | | |
|---|---|---|---|---|
| JP | 2007-184315 | A | | 7/2007 |
| JP | 2009-194212 | A | | 8/2009 |
| JP | 2012-028561 | A | | 2/2012 |
| JP | 2012079950 | A | * | 4/2012 |
| KR | 20030080900 | A | | 10/2003 |
| WO | 2018/202615 | A1 | | 11/2018 |

* cited by examiner 1
45
24
45
45
41
40
4
5
2
21
22
23
30
3
20
29
43

1
51
41
24
20
41
40
4
5
T
D
2
30
3
42
29
31,33

1
5,41
24
41,45
40
4
46
44
23
2
30
3
42
25
29
20
31,33

POWER SEMICONDUCTOR DEVICE AND MANUFACTURING METHOD

CROSS-REFERENCE TO RELATED APPLICATIONS

This application is US National Stage of International Patent Application PCT/EP2022/051078, filed Jan. 19, 2022, which claims priority to European Patent Application No. 21159002.1, filed on Feb. 24, 2021, the contents of which are incorporated herein by reference.

A power semiconductor device and a method for manufacturing such a power semiconductor device are provided.

Document US 2018/0114740 A1 refers to a transistor package.

Document WO 2018/202615 A1 discloses a resin encapsulated power semiconductor module with exposed terminal areas.

Documents KR 2003 0080900 A, U.S. Pat. No. 5,105,259 A, US 2014/0332951 A1, US 2015/0137344 A1, US 2005/0082690 A1 and EP 0 577 966 A1 refer to electric devices.

A problem to be solved is to provide a power semiconductor device that has improved thermal behavior, for example, without the usage of connection methods like soldering, sintering, glueing or screwing.

This object is achieved, inter alia, by a power semiconductor device and by a method as defined in the independent patent claims. Exemplary further developments constitute the subject-matter of the dependent claims.

For example, the power semiconductor device described herein comprises a support, a heat sink and a mold body. The support is pressed directly onto the heat sink by the mold body so that no further means for attaching or holding the support on the heat sink is required. Thus, there can be a direct thermal path from the support to the heat sink without additional thermal resistance due to, for example, a thermal paste, a solder or a sinter join.

In at least one embodiment, the power semiconductor device comprises at least one support, at least one power semiconductor chip is arranged on a support top side of the at least one support. Further, the power semiconductor device includes a heat sink having a heat sink top side, the at least one support is arranged on the heat sink top side. A mold body of an electric insulating material is in direct contact with the at least one support and with the heat sink. The mold body fixes and presses the at least one support onto the heat sink. Optionally, the mold body is the only component in the power semiconductor device adhesively bonded to the heat sink, and the at least one support is fixed to the heat sink by means of the mold body in a force-fit manner, and there is at least one recess in the mold body running from a mold body top side facing away from the heat sink to the support top side and at least one electric wiring is running through the at least one recess.

Power semiconductor devices are important components of inverters that generate heat during operation. Dissipating the heat is important to operate the inverter efficiently. To this end, supports carrying power semiconductor chips are attached to heat sinks, and air or liquids are often utilized as cooling media or coolant. Moreover, the power semiconductor devices are operated at high voltages. This requires an efficient electrical insulation of the devices, typically by encapsulating the power device structure with silicone gel, or with potting or molding compounds which are often epoxy-based.

An alternative possibility to fix the support onto the heat sink is to clamp the power semiconductor device with screws or the like to the heat sink and to apply a thermal interface material, TIM for short, in between to ensure a proper thermal contact. To overcome the relatively low thermal conductivity of TIMs, it is possible to manufacture power semiconductor devices with integrated cooling structures. Thus, power semiconductor devices need to be attached, for example, by screws, and also need to be sealed, for example, by rubber gaskets, to a cooler housing to employ liquid cooling.

That is, usage of a TIM limits the thermal path and thereby the performance of power semiconductor devices, eventually leading to higher system costs. Usage of integrated cooling structures requires an additional seal against the coolant liquid adding cost of additional parts and process steps.

In the power semiconductor device described herein, the encapsulation material, that is, the mold body, is also employed to attach the support to the heat sink and potentially also as a sealing material. To this end, open non-encapsulated power modules, that is, supports carrying the power semiconductor chips, are assembled on the heat sink which can be an open or closed cooler. Assembly is done by a pick-and-place process, for example. To precisely define the lateral position of the support on the heat sink, alignment features may optionally be used. Then, the supports are firmly pressed onto the heat sink during an encapsulation process which is, for example, transfer molding or compression molding of at least one hard mold compound.

Consequently, in addition to its purpose of electrical insulation, the mold body as the encapsulation material also fixes the support on the heat sink, and permanently provides pressure on the support—heat sink interface. The heat sink may include features to maximize the bonding strength to the mold compound in order to provide a reliable and strong thermal and mechanical contact.

Hence, any cost related to additional clamping, sealing, bonding material and process steps can be saved by using the power semiconductor device described herein.

In short, in the power semiconductor device described herein, the substrate of a power module, that is, the support, is mechanically attached to a heat sink by means of an encapsulation material, that is, the mold body, wherein no additional interconnection layer, like a solder or sinter layer or glueing, is needed between the substrate and the heat sink. The power module may comprise at least one electrically insulating substrate, at least one power semiconductor device like a MOSFET, an IGBT, or a diode, made from silicon or silicon carbide. The encapsulation material may be an epoxy-based mold component or a silicone-based mold compound. The encapsulation material is not directly in the thermal path between the power device and the heat sink. To maximize the mechanical strength of the connection between the support and the heat sink, anchoring features can be manufactured in the top side of the heat sink which will be filled by encapsulation material, for example, T-sections, L-sections, or angled grooves which are easier to manufacture. Open or closed coolers could be used. The insulating support may comprise an integrated cooling structure. In that case, the heat sink is an open cooler with at least one inlet and one outlet for the cooling medium, and at least one opening per support in which the cooling structure of the support is at least partly immersed. In a different embodiment, the heat sink is a closed cooler with at least one inlet and one outlet for the cooling medium, and with an integrated cooling structure like fins and/or channels. In that case, the thermal contact between the substrate and the closed cooler may be improved by additional non-bonding materials, like a thermal interface material, or metal particles. Features may remain in the final structure that were required to achieve a strong mechanical contact during the encapsulation process. Possible features may be insulated posts, for example, made by transfer or compression molding, or exposed areas.

According to at least one embodiment, the at least one support is provided with one or with a plurality of power semiconductor chips. Hence, the support can be the substrate of a power semiconductor module. For example, the power semiconductor chip or the power semiconductor chips of the power semiconductor device are configured for voltages of at least 400 V or of at least 650 V or of at least 1.0 kV or of at least 1.2 kV or of at least 1.6 kV. In addition, the at least one power semiconductor chip may be configured for currents of at least 1 A or of at least 10 A or of at least 50 A.

According to at least one embodiment, the at least one power semiconductor chip is selected from the following group: a metal-oxide-semiconductor field-effect transistor (MOSFET), a metal-insulator-semiconductor field-effect transistor (MISFET), an insulated-gate bipolar transistor (IGBT), a bipolar junction transistor (BJT), a thyristor, a gate turn-off thyristor (GTO), a gate commutated thyristor (GCT), a junction gate field-effect transistor (JFET), and a diode. If there is a plurality of the power semiconductor chips, then all the semiconductor chips can be of the same type, or there are different types of semiconductor chips.

According to at least one embodiment, the support top side is of overall planar fashion. In other words, the support may be plane-parallel board. This does not include that the support top side may be provided with conductor tracks structured into a metal layer on the support top side.

According to at least one embodiment, the mold body is the only component in the power semiconductor device adhesively bonded to the heat sink top side or to the heat sink. For example, there is no adhesive bond between the heat sink and the support, and the support can directly be applied on the heat sink top side. It is possible that the only metallic and/or electrically conductive connection between the support and the heat sink is by the support itself, and consequently not by means of a solder, a sinter layer or conductive particles in a paste. Otherwise, it is possible that there is an intermediate layer between the heat sink and the support, the intermediate layer is, for example, a TIM layer. By means of the intermediate layer, an unevenness or roughness of the heat sink top side and/or of the support bottom side can be filled to increase thermal contact between the heat sink and the support.

According to at least one embodiment, the at least one support is fixed to the heat sink by means of the mold body in a force-fit manner. In other words, by means of the mold body the support can be presses so strongly onto the heat sink so that lateral movement of the support relative to the heat sink is hindered by friction.

According to at least one embodiment, the heat sink top side is of planar fashion. That is, the heat sink top side may be free of any curvature. Further, the heat sink top side may be smooth. For example, a mean roughness, also referred to as Ra, of the heat sink top side is at least 0.5 μm or at most 10 μm or at most 5 μm. For example, the heat sink top side is a polished surface. The same may apply for a substrate bottom side being in contact with the heat sink top side. Otherwise, the heat sink top side and/or the support bottom side may have a certain roughness to improve the thermal contact, with or without the additional intermediate layer like a paste or a TIM.

According to at least one embodiment, seen in top view of the heat sink top side, the heat sink top side protrudes from the mold body at least in places or all around. For example, there is no place in which the mold body protrudes from the heat sink, seen in top view of the heat sink top side. It is possible that in a lateral direction the heat sink and the mold body may terminate flush with each other.

As an alternative, the mold body may partially enclose the heat sink so that the mold body may extend to lateral faces or to a bottom side of the heat sink, said bottom side is opposite the heat sink top side.

According to at least one embodiment, the support bottom side of the at least one support, which is opposite the respective support top side, is a planar and continuous face. The support bottom side can be free of any curvature and may be a polished surface. For example, there are no holes in the support bottom side so that no screws or the like travers the support bottom side.

According to at least one embodiment, the mold body is attached to the heat sink by means of at least one form-locked join. In other words, the mold body penetrates the heat sink top side, and interlocking features in the heat sink will be filled during a mold process. For example, the mold body comprises one or a plurality of protrusions as the form-locked join running into the heat sink through the heat sink top side. Additionally or alternatively, the heat sink may comprise at least one protrusion as an anchoring element at which or around which the mold body is formed by molding to achieve improved mechanical contact.

According to at least one embodiment, the form-locked join comprises at least one of the following elements running into the heat sink, seen in cross-section of the heat sink perpendicular to the heat sink top side: a T-shaped anchoring element, an L-shaped anchoring element, a V-shaped protuberance, a trapezoidal protuberance, a rectangular protuberance. Hence, the respective protrusion may be comparably narrow directly at the heat sink top side and may become broader within the heat sink. Also at least one roughening is possible as an anchoring structure. The same may apply to protrusions of the heat sink and consequently to recesses in the mold body.

Otherwise, a width of the respective protrusion may reduce monotonously or strictly monotonously along an inward direction of the heat sink, thus heading away from the support. 'Form-locked' may mean that the respective protrusion of the mold body is all around in direct contact with the heat sink. It is possible that there are different kinds of protrusions in combination, or that all protrusions are of the same shape.

According to at least one embodiment, there is one or a plurality of recesses in the mold body. For example, the at least one recess runs from a mold body top side facing away from the heat sink to the support top side. Hence, the support top side may partially be free of the mold body.

For example, seen in top view of the support top side, the at least one recess amount to at most 20% or 10% of an area of the respective support top side. Hence, the at least one recess is only on a comparably small portion of the support top side. Other parts of the support top side, not affected by the at least one recess, are preferably covered by the mold body.

It is not required that the at least one recess ends directly on the support top side, but that there is no material of the mold body on the support top side in the area of the at least one recess, seen in top view of the support top side. That is, the at least one recess may also run to the at least one power semiconductor chip.

According to at least one embodiment, the power semiconductor device further comprises one or a plurality of posts. The at least one post is partially or completely located in the at least one recess. For example, the at least one post touches the support top side or the at least one power semiconductor chip. The at least one post may terminate flush with the mold body top side or otherwise may protrude from the mold body top side in a direction away from the heat sink. In a lateral direction, in parallel with the support top side, the at least one post may all around be in direct contact with the mold body. Hence, the mold body may be molded onto the at least one post, or vice versa.

For example, the at least one post is of a hard material, that is, of a material more rigid than the mold body. It is possible that the at least one post is of a hard plastic or of a metal or of a ceramic. Otherwise, the at least one post can be of a soft material, that is, of a material less rigid than the mold body. In the latter case, the at least one mold body may be of a soft plastic, like a silicone resin or a silicone rubber, in order to close the at least one recess.

Further, it is possible that there is an electric wiring in the at least one recess. Hence, through the recess, the at least one support may electrically be contacted. In this case, for purpose of electrical insulation, the recess may be filled up with an electrically insulating material like a silicone-based material.

According to at least one embodiment, the heat sink is an open cooler so that a coolant provided through the heat sink is configured to circulate in the support. That is, by the heat sink the support is provided with the coolant. Hence, the support may be provided with at least one channel for the coolant. Otherwise, the coolant may flow directly at the support bottom side but may not penetrate the support, or, in the case of a closed cooler, the coolant may be limited to an interior of the heat sink and/or may not be in direct contact with the support. For example, the coolant is a gas like air or a liquid like water or oil.

According to at least one embodiment, the mold body provides a sealing for the coolant. In other words, because of the mold body there is no leakage of coolant between the support and the heat sink, if the coolant comes into direct contact with the support. For example, the mold body is the only sealing for the coolant at the interface support—heat sink. Hence, there is no need for an additional gasket or the like. In this respect, it is possible that the mold body could be produced in a multi-step molding process, for example, using two steps with two different materials, like one material for the sealing and another material for insulation and mechanical strength.

According to at least one embodiment, the support comprises an electrically insulating body. Said electrically insulating body may be the part of the support that mechanically carries the support and, thus, the at least one power semiconductor chip. For example, the electrically insulating body is of a ceramic.

According to at least one embodiment, the electrically insulating body is provided with at least one metallization layer. For example, the electrically insulating body is located between two metallization layers so that the support top side is formed by one of the metallization layers and the support bottom side may be formed be the other one of the metallization layers.

According to at least one embodiment, the support is an insulated substrate, for example, a direct bonded copper substrate, an active metal brazed substrate, an insulated metal substrate comprising the central electrically insulating body which is, for example, of a ceramic like $Al_2O_3$, SiN, or AlN, and the at least one metallization layer on each main side of the electrically insulating body. Hence, the support can be optimized for low thermal resistance between the heat sink and the at least one power semiconductor chip.

According to at least one embodiment, the electrically insulating body and/or the at least one metallization layer comprises at least one fastening at a lateral face of the support. The fastening may have a reduced thickness compared with other parts of the respective support. The fastening may protrude into the mold body in order to enhance a mechanical connection between the mold body and the support. For example, the fastening comprises at least one protrusion and/or roughening towards the mold body.

According to at least one embodiment, the mold body is made of a comparably hard material, for example, of an epoxy mold compound based on an epoxy resin, for example, a multi-aromatic resin or a multi-functional resin, and with a high content, for example, of at least 70% and/or at most 95% of filler material of, for example, silicon oxide, aluminum oxide, or silicon nitride. For example, the mold body has, at, for example, a temperature of 297 K, a flexural modulus of at least 5 GPa or of at least 10 GPa and/or of at most 40 GPa or of at most 30 GPa; alternatively or additionally, the mold body is made of a comparably soft material, for example, based on a silicone resin, and has a flexural strength of at least 5 MPa or of at least 10 MPa and/or of at most 100 MPa or of at most 70 MPa.

According to at least one embodiment, the support top side comprises at least one of Cu, Al and Ni or consists thereof. For example, the metallization layer forming the support top side is a copper layer. By using such materials, improved adhesion between the metallization layer and the mold body can be achieved. It is also possible that thin coatings are applied on a metallization layer like a thick copper layer to avoid, for example, oxide layers hampering an electrical connection. In this context, 'thin' may mean at most 1 μm and 'thick' may mean at least 10 μm.

According to at least one embodiment, the mold body comprises at least one filler. The filler may be of an inorganic material like silicon dioxide, aluminum oxide, or silicon nitride. However, organic and inorganic fillers may be combined in the mold body. By means of at least one filler, a coefficient of thermal expansion, CTE for short, of the mold body may be adapted to comply with a CTE of the support and/or of the heat sink.

According to at least one embodiment, the at least one filler is provided in the form of particles distributed in the mold body. For example, said particles are distributed in a homogeneous manner in the whole mold body. Otherwise, the filler or at least one of the fillers may be provided in an inhomogeneous manner, for example, only near the support, or with a certain gradient of mass fraction. If there is a plurality of fillers, the respective kinds of particles may have different shapes and/or sizes.

According to at least one embodiment, a mass fraction of the at least one filler, or of all fillers together, on the overall mold body is at least 20% or at least 70% or at least 80%. Alternatively or additionally, said mass fraction is at most 60% or at most 90% or at most 95%.

According to at least one embodiment, seen in cross-section perpendicular to the support top side, an edge length, like a mean or maximum edge length, of the at least one support, in parallel with the support top side, is at least 2 cm or at least 3 cm and/or at most 10 cm.

According to at least one embodiment, seen in cross-section perpendicular to the support top side, a thickness of the mold body is at least 0.2 cm or at least 0.3 cm and/or at most 2 cm or at most 1 cm. For example, the thickness of the mold body exceeds a thickness of the support by at least a factor of 2 and/or by at most a factor of 10 or by at most a factor of 5.

According to at least one embodiment, seen in cross-section perpendicular to the support top side, a projection length of the mold body over the respective support top side, in parallel with the support top side, is at least 1 mm or at least 2 mm and/or at most 8 mm or at most 6 mm.

According to at least one embodiment, at, for example, a temperature of 297 K, the at least one support is pressed onto the heat sink top side by the mold body with a pressure of at least 0.05 MPa or of at least 0.2 MPa and/or of at most 5 MPa or of at most 2 MPa. Said pressure may be a mean pressure averaged over the whole support bottom side. For example, the mean pressure is the quotient of the force, the support is pressed onto the heat sink due to the mold body, and the area content of the support bottom side.

According to at least one embodiment, the power semiconductor device comprises plurality of the supports. All the supports may be arranged distantly from one another on the heat sink top side. Thus, adjacent supports may not touch each other. The supports may be arranged in a regular grid. For example, there are at least two or at least four supports and/or there are at most 64 or at most 16 supports.

According to at least one embodiment, all the supports are located between the heat sink and the mold body. For example, all the supports are only in contact with the heat sink and the mold body, discounting the optional at least one recess and the optional coolant.

The power semiconductor device is, for example, a power module to convert direct current from a battery to alternating current for an electric motor, for example, in vehicles like hybrid vehicles or plug-in electric vehicles.

A method for manufacturing the power semiconductor device is additionally provided. By means of the method, a power semiconductor device is produced as indicated in connection with at least one of the above-stated embodiments. Features of the power semiconductor device are therefore also disclosed for the method and vice versa.

In at least one embodiment, the method for manufacturing the power semiconductor device comprises, for example, in the stated order:

A) providing the heat sink,

B) placing the at least one support directly on the heat sink top side,

C) pressing the at least one support onto the heat sink and at the same time forming the mold body onto the at least one support and onto the heat sink top side.

A power semiconductor device and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

Figure 2:
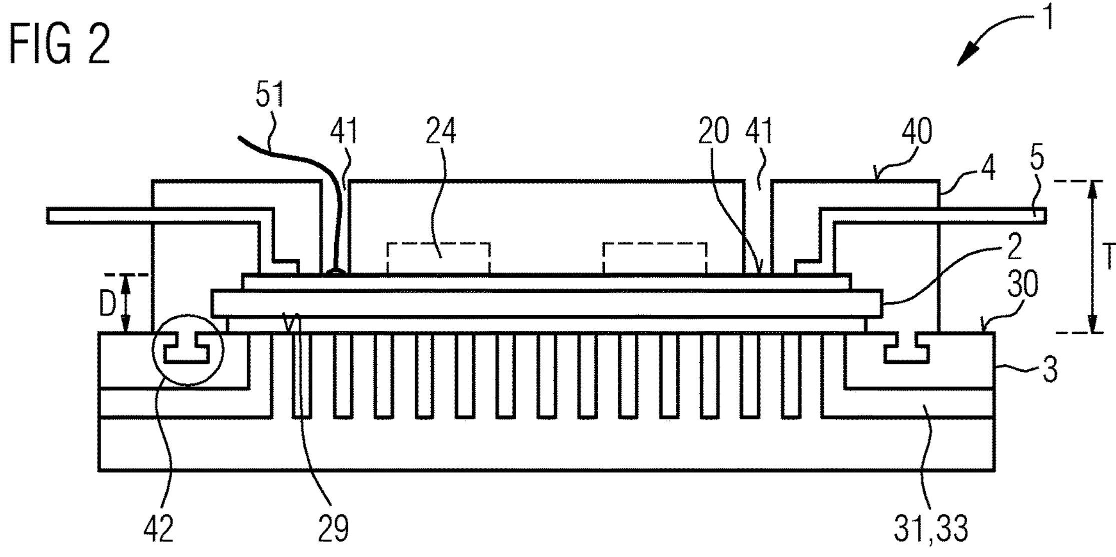
Figure 3:
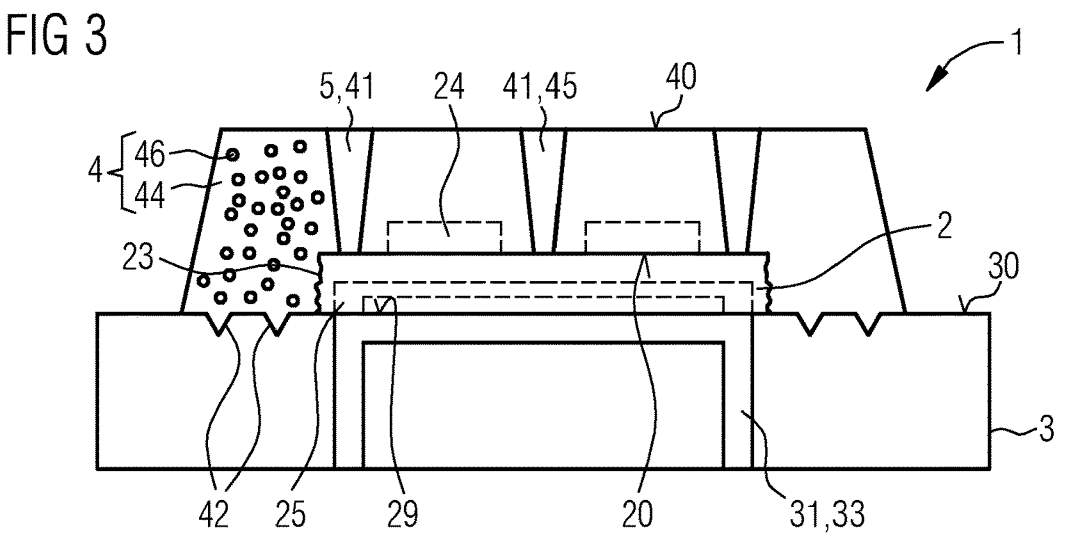
Figure 4:
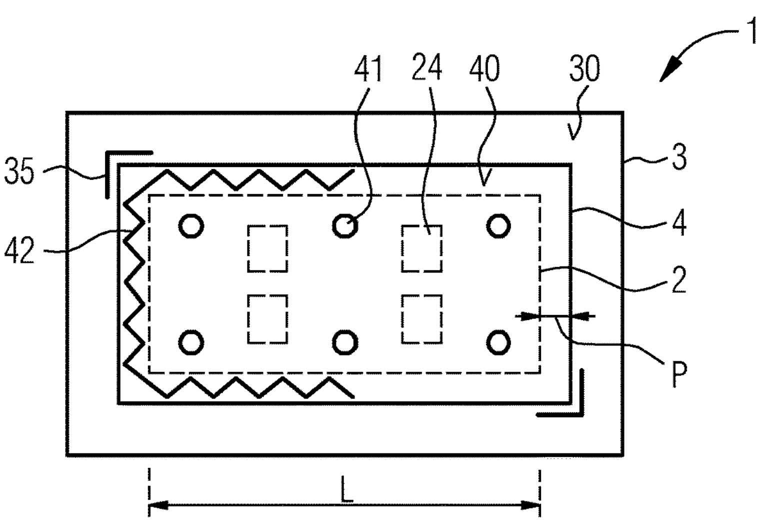
Figure 5:
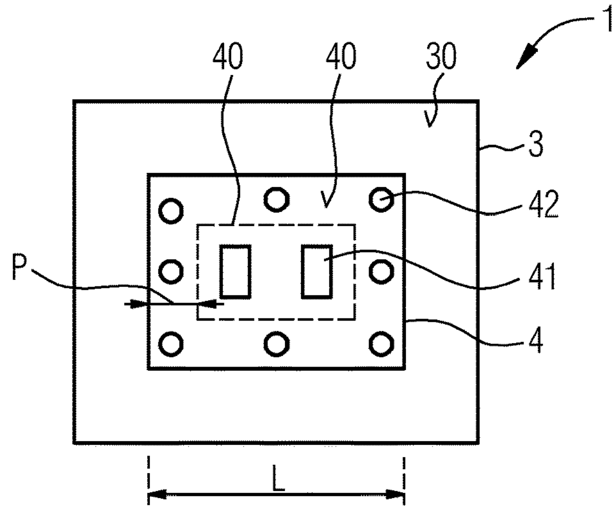
Figure 6:
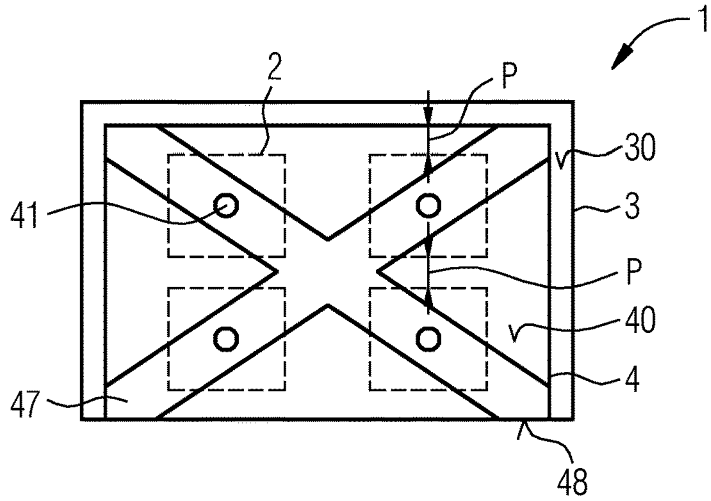
Figure 7:
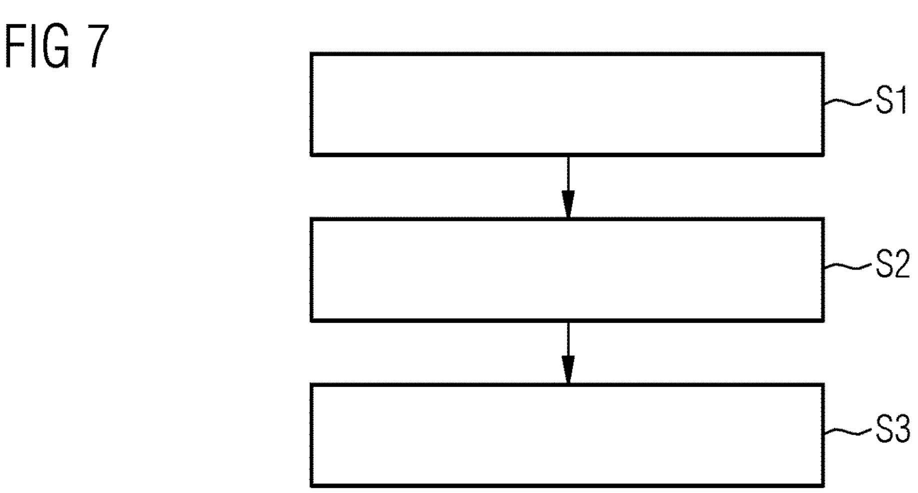
Figure 8:
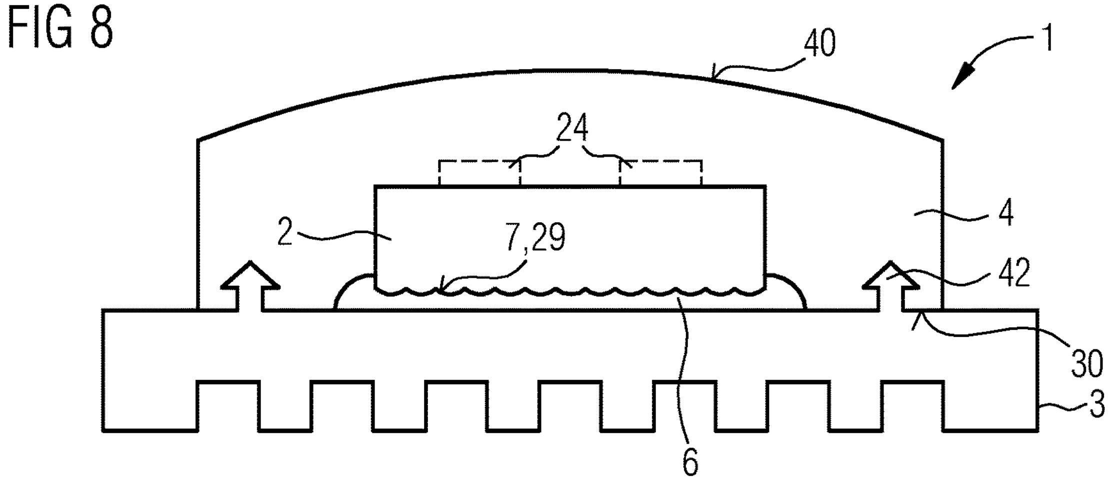
Figure 9:
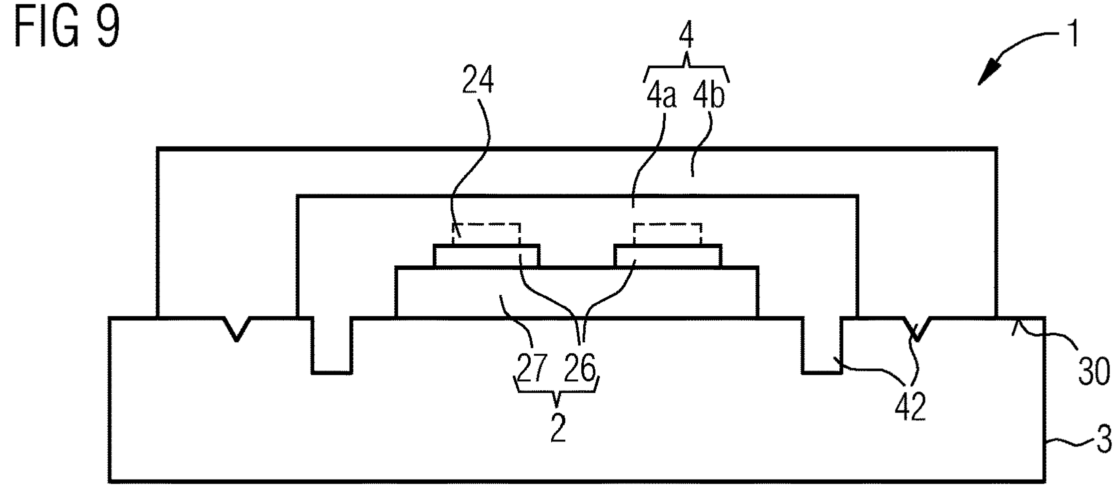

In the figures:

FIGS. 1 to 3 are schematic sectional views of exemplary embodiments of power semiconductor devices described herein, FIGS. 4 to 6 are schematic top views of exemplary embodiments of power semiconductor devices described herein, FIG. 7 is a schematic block diagram of an exemplary embodiment of a method to manufacture power semiconductor devices described herein, and FIGS. 8 and 9 are schematic sectional views of exemplary embodiments of power semiconductor devices described herein.

In FIG. 1, an exemplary embodiment of a power semiconductor device 1 is illustrated. The power semiconductor device 1 comprises a heat sink 3 with a heat sink top side 30. The heat sink top side 30 is of overall planar fashion. Further, the power semiconductor device 1 comprises a support 2 carrying power semiconductor chips 24. The support 2 with all components on it, like the power semiconductor chips 24, may also be referred to as power module.

For example, the support 2 is a direct bonded copper substrate and is composed of an electrically insulating body 22 having a metallization layer 21 on a support top side 20 and on a support bottom side 29. The support top side 20 as well as the support bottom side 29 are of planar fashion, but as an option the metallization layer 21 on the support top side 20 may be structured to comprise electric contact areas and electric conductor tracks, not shown.

Moreover, the power semiconductor device 1 has a mold body 4 with a mold body top side 40 facing away from the heat sink 3. For example, seen in cross-section the mold body 4 has a rectangular outer contour. The mold body 4 is in direct contact with the heat sink 3 and with the support 2. By means of the mold body 4, the support 2 is directly pressed and fixed onto the heat sink so that no additional means is required to fasten the support 2. Accordingly, an interface between the support 2 and the heat sink 3 is free of any adhesive layer like a solder or a glue or a thermal interface material. A pressure of the support bottom side 29 on the heat sink top side 30 caused by the mold body 4 is, for example, 1 MPa.

As an option, to enhance adhesion, in a contact region between the mold body 4 and the heat sink 3 there can be a roughening 43. For example, a mean roughness Ra of the roughening 43 is at least 10 μm or at least 30 μm and/or at most 0.3 mm or at most 0.1 mm. For example, the mold body 4 is of an epoxy resin and the metallization layers 21 are of copper.

As a further option, to enhance adhesion between the mold body 4 and the support 2, the support 2 can have fastenings 23 on lateral sides. Other than shown, such fastening may also be present at the support top side 20. Such fastenings 23 can be a roughening or at least one protrusion extending into the mold body 4. For example, the metallization layers 21 are set back relative to the electrically insulating body 22.

In order to press the support 2 onto the heat sink 3 during manufacture of the power semiconductor device 1, there can be posts 45. The posts 45 may be applied on the support 2 before the mold body 4 is produced. Hence, a mold material for the mold body 4 may be all around in direct contact with the posts 45.

For example, the posts 4 are of a metal or of an electrically insulating material like a hard epoxy resin, too. After forming the mold body 4, the posts 45 may remain in the power semiconductor device 1 and may protrude from the resin body 4. The posts 45 may be manufactured by a preceding molding process or may be made as separate pre-fabricated parts, like separately molded plastics dowels.

Moreover, in FIG. 1 it is shown that the power semiconductor device 1 can comprise electric terminals 5 running through the mold body 4. As an option, the electric terminals 5 may be used alternatively or additionally to the posts 45 to press the support 2 onto the heat sink 3 during manufacturing the mold body 4. For this purpose, for example, the electric terminals 5 may not run through lateral sides of the mold body, as illustrated in FIG. 1, but may run through the mold body top side instead.

Another exemplary embodiment of the power semiconductor device 1 is illustrated in FIG. 2. According to FIG. 2, the heat sink 3 is a closed cooler. That is, the heat sink 3 comprises channels 31 in which a gas or liquid is led through the heat sink 3 as a coolant 33. Such a closed cooler may be used in all other exemplary embodiments, too.

Moreover, in FIG. 2 it is shown as an option that the mold body 4 is attached to the heat sink 3 in a form-locked manner by means of a form-locked join 42 filled during a molding process, for example. The form-locked join 42 is composed of a T-shaped anchoring element engaging into the heat sink 2 and consequently traversing the heat sink top side 30. Other than shown, the form-locked join 42 may alternatively or additionally include an L-shaped anchoring element, a V-shaped protuberance, a trapezoidal protuberance, or a rectangular protuberance. Such features can facilitate a strong bonding strength between the support 2 and the heat sink 3.

Further, according to FIG. 2 there are recesses 41 in the mold body 4 running from the mold body top side 40 to the support top side 20. Instead of pressing onto the post 45 of FIG. 1, it is also possible that features in a mold tool, not shown, press onto the support 2 during the molding process for the mold body 4. Then, exposed areas will remain on the support top side 20 and the recesses 41 are formed.

As an option, the exposed areas may either be used to make auxiliary control contacts, to attach terminals and/or busbars, or may be completely or partially filled with an encapsulation material in a subsequent process step, not shown. It may be beneficial to fill the recesses 41 with a soft encapsulation material to reduce the strain on the mold body 4. Hence, there can be at least one electric wiring 51 running through the at least one recess 41. Such an electric wiring 51 could also be present in all other exemplary embodiments.

For example, a thickness T of the mold body 4 is 6 mm and a thickness D of the support 2, from the support bottom side 29 to the support top side 20, is 2 mm. Hence, the mold body 4 may be thrice as thick as the support 2.

Otherwise, the same as to FIG. 1 may also apply to FIG. 2.

According to FIG. 3, the mold body 4 may have inclined side faces to simplify removal of a mold tool. In order to improve adhesion with the heat sink 3, there may be multiple V-shaped grooves in the heat sink 3 for the form-locked joins 42, for example, arranged in two lines. Such grooves can easily be manufactured into the heat sink 3.

As an option, the recesses 41 are filled with the posts 45 and may have the shape of a truncated pyramid or of a truncated cone. Hence, the recesses 41 may become narrower towards the support 2. As a further option, the posts 45 may be used to electrically contact the support 2 and, hence, may work as electric terminals 5. For this purpose, electric contact areas may be formed on the mold body top side 40, not shown.

For example, the mold body 4 is composed of a base material 44, like an epoxy resin, and of particles of a filler 46. The filler 46 is, for example, silicon dioxide. Contrary to what is shown in FIG. 3 it is possible that the filler 46 is homogeneously distributed throughout the whole mold body 4.

Further, the heat sink 3 can be an open cooler. Hence, contrary to what is illustrated in FIG. 2, the coolant 33 may come in close contact with the support 2. In a first variant, the channels 31 lead the coolant to the support bottom side 29 so that the coolant is led across the support bottom side 29, but does not enter the support 2. In a second variant, shown by dashed lines, there is an internal cooling structure 25 in the support 2 to lead the coolant 33 directly through the support 2.

The mold body 4 here serves as a seal, too, in order to avoid leakage of the coolant 33 out of the interface between the support 2 and the heat sink 3 so that a dry contact, for example, a contact without an additional adhesive like a solder, between the heat sink 3 and the support 2 can be maintained. Such heat sinks 3 can also be used in all other exemplary embodiments.

Otherwise, the same as to FIGS. 1 and 2 may also apply to FIG. 3.

In FIG. 4 it is illustrated that the form-locked join 42 may run partially or also completely around the support 2, when seen in top view. As an option, the form-locked join 42 may serve as a sealing means when the optional coolant 33 is used. For example, a largest edge length L of the support 2 is 55 mm and a projection length P of the mold body 4 beyond the support top side 20 is 2 mm.

As an option, there can be alignment marks 35 to enable precise placing of the support 2 onto the heat sink 3. This may also be true in all other exemplary embodiments.

Otherwise, the same as to FIGS. 1 to 3 may also apply to FIG. 4.

According to FIG. 5, the heat sink 3 and the support 2 are of square shape, seen in top view. As an option, the form-locked joints 42 are arranged all around the support top side in a regular grid.

Moreover, in FIG. 5 it is illustrated that the recesses 41 does not need to be of circular fashion, like in FIG. 4, but may also be of rectangular shape or the like.

Both configurations, that is, frame-like or line-like form-locked joints 42 as in FIG. 4 and point-like form-locked joints 42 as in FIG. 5, can be used in all the exemplary embodiments, also in combination, so that there can be at least one point-like form-locked joint 42 as well as at least one frame-like or line-like form-locked joint 42. Further, if there is a plurality of point-like form-locked joints 42, these form-locked joints 42 can have different shapes, seen in cross-section. If there is at least one frame-like or line-like form-locked joint 42, it is possible that along the respective form-locked joint 42 a cross-section varies, for example, the respective form-locked joint 42 can become narrower and broader, seen in top view, and may appear like a pearl necklace or a lozenge line in which lozenges follow one another along a line. The same applies to all other exemplary embodiments.

Otherwise, the same as to FIGS. 1 to 4 may also apply to FIG. 5, and vice versa.

In the exemplary embodiment of FIG. 6 it is illustrated that there is a plurality of the supports 2 on the common heat sink 3. For example, the supports 2 are arranged in a regular grid. The projection length P may also be maintained between adjacent supports 2.

Moreover, the mold body 4 may comprise at least one reinforcement structure 47. For example, the reinforcement structure 47 is formed by thickened parts of the mold body 4 protruding from remaining portions of the mold body top side 40. It is possible that the reinforcement structure 47 if formed by a cross fixed at corners of the mold body top side 40, or by a line perpendicular from one side to the other, seen in top view. By means of such reinforcement structures 47, a more homogeneous pressure of the support 2 onto the heat sink 3 may be achieved all across the support bottom side 29.

The optional recesses 41 may be arranged within the reinforcement structure 47, or may be arranged next to the reinforcement structure 47, other than shown in FIG. 6. Moreover, as a further option, the recesses 41 may not be next to the power semiconductor chips 42, but may be on top of the power semiconductor chips 24.

Otherwise, the same as to FIGS. 1 to 5 may also apply to FIG. 6.

In FIG. 7 a method for producing the power semiconductor device 1 is briefly illustrated. In method step S1, the heat sink 3 is provided. According to method step S2, the support 2, or the supports 2, is/are placed directly on the heat sink top side 30. In method step S3, the at least one support 2 is pressed onto the heat sink 3, and at the same time the mold body 4 is formed onto the at least one support 2 as well as onto the heat sink top side 30.

The mold body 4 is formed, for example, by means of one-stage or multi-stage compression molding or transfer molding or casting. It is possible that the mold body 4 is produced at elevated temperatures well above an intended operation temperature of the power semiconductor device 1. Hence, when cooling down from production temperature, the mold body 4 may additionally press onto the support 2 due to thermal shrinking of the mold body 4.

In the exemplary embodiment of FIG. 8, there is an intermediate layer 6 between the support 2 and the heat sink 3. For example, the intermediate layer 6 is of a thermal interface material. It is possible that the intermediate layer 6 completely extends between the support 2 and the heat sink 3, and may protrude from the support 2.

For example, by means of such an intermediate layer 6, the support bottom side 29 may purposefully be provided with a roughening 7. As a further option, not shown in FIG. 8, such a roughening 7 may additionally or alternatively be present on the heat sink top side 30 to improve adhesion and anchoring between the mold body 4 and the heat sink 3.

As a further option, it is possible that anchoring structures for the form-locked join 42 are realized by protrusions from the heat sink top side 30. The mold body 4 is molded around these protrusions, or may also be pre-molded and then pressed and locked at the form-locked join 42, for example, in case of having a prestressing.

Moreover, it is optionally possible that the mold body 4 comprises a curved mold body top side 40, seen in cross-section, for example, to better enable the prestressing, if the mold body 4 is pre-molded before being applied onto the heat sink 3. Further, the heat sink 3 may comprise cooling fins.

Otherwise, the same as to FIGS. 1 to 7 may also apply to FIG. 8, and vice versa.

According to FIG. 9, the support 2 is composed of a base plate 27 and of one or a plurality of substrates 26. The substrates may be of a semiconductor material, or may even be wafers including the at least one power semiconductor chip 24. The base plate 27 is a metallic plate, for example. Other than shown in FIG. 9, there can be a plurality of base plates 27.

Further, according to FIG. 9 the mold body 4 is composed of a first part 4*a* and of a second part 4*b*. For example, the first part 4*a* is of a soft material like a silicone resin. By means of the first part 4*a*, improved sealing for a coolant, not shown in FIG. 9, can be established. The second part 4*b* is formed around the first part and may be of a more rigid material than the first part 4*a*, for example, of an epoxy resin.

It is possible that there are multiple recesses in the heat sink top side 30 for the form-locked joins 42. For example, there is one inner form-locked join 42 for the first part 4*a* and one outer form-locked join 42 for the second part 4*b*. These form-locked joins 42 may have different shapes. For example, the inner form-locked join 42 completely surrounds the support 2, seen in top view, and the outer form-locked join 42 may be of multi-point-like fashion, seen in top view, as illustrated in FIG. 5.

Otherwise, the same as to FIGS. 1 to 8 may also apply to FIG. 8, and vice versa.

The components shown in the figures follow, unless indicated otherwise, preferably in the specified sequence directly one on top of the other. Components which are not in contact in the figures are preferably spaced apart from one another. If lines are drawn parallel to one another, the corresponding surfaces are preferably oriented in parallel with one another. Likewise, unless indicated otherwise, the positions of the drawn components relative to one another are correctly reproduced in the figures.

The power semiconductor device described here is not restricted by the description given with reference to the exemplary embodiments. Rather, the power semiconductor device encompasses any novel feature and any combination of features, including in particular any combination of features in the claims, even if this feature or this combination is not itself explicitly indicated in the claims or exemplary embodiments.

This patent application claims the priority of European patent application 21 159 002.1, the disclosure content of which is hereby incorporated by reference.

LIST OF REFERENCE SIGNS

1 power semiconductor device
2 support
20 support top side
21 metallization layer
22 electrically insulating body
23 fastening
24 power semiconductor chip
25 internal cooling structure
26 substrate
27 base plate
29 support bottom side
3 heat sink
30 heat sink top side
31 channel
33 coolant
35 alignment mark
4 mold body
4*a* first part of the mold body
4*b* second part of the mold body
40 mold body top side
41 recess
42 form-locked join
43 roughening
44 base material
45 post
46 filler
47 reinforcement structure
48 common face
5 electric terminal
51 electric wiring
6 intermediate layer
7 roughening
D thickness of the support
L edge length of the support
P projection length mold body—support top side
S method step
T thickness of the mold body

The invention claimed is:

1. A power semiconductor device comprising at least one support, at least one power semiconductor chip is arranged on a support top side, a heat sink having a heat sink top side, wherein the at least one support is arranged on the heat sink top side, and a mold body of an electric insulating material in direct contact with the at least one support and the heat sink, wherein the mold body fixes and presses the at least one support onto the heat sink, wherein the mold body is an only component in the power semiconductor device adhesively bonded to the heat sink, and the at least one support is fixed to the heat sink by means of the mold body in a force-fit manner, wherein the at least one support is not directly bonded to the heat sink and is held in place solely by the force-fit manner provided by the mold body pressing the support onto the heat sink, and wherein there is at least one recess in the mold body running from a mold body top side facing away from the heat sink to the support top side and at least one electric wiring is running through the at least one recess.

2. The power semiconductor device according to claim 1, wherein, seen in top view of the heat sink top side, the heat sink top side protrudes all around from the mold body and the at least one support is directly arranged on the heat sink top side.

3. The power semiconductor device according to claim 1, wherein a support bottom side of the at least one support is opposite the respective support top side and is a planar and continuous face.

4. The power semiconductor device according to claim 1, wherein the mold body is attached to the heat sink by means of at least one form-locked join so that the mold body penetrates the heat sink top side, or so that the heat sink penetrates a mold body bottom side.

5. The power semiconductor device according to claim 4, wherein the form-locked join comprises at least one of following elements running into the heat sink, seen in cross-section of the heat sink: a T-shaped anchoring element, an L-shaped anchoring element, a V-shaped protuberance, a trapezoidal protuberance, a rectangular protuberance, a roughening.

6. The power semiconductor device according to claim 1, wherein through the at least one recess, the at least one support is electrically contacted, and the at least one recess is at least partially filled with an electrically insulating material.

7. The power semiconductor device according to claim 6, further comprising at least one post, wherein the at least one post is located in the at least one recess, touches the support top side and protrudes from the mold body top side in a direction away from the heat sink.

8. The power semiconductor device according to claim 1, wherein the heat sink is an open cooler so that a coolant provided through the heat sink is configured to circulate in the support, and wherein the mold body provides a sealing for the coolant.

9. The power semiconductor device according to claim 1, wherein the support comprises an electrically insulating body between two metallization layers, the support top side is formed by one of the metallization layers.

10. The power semiconductor device according to claim 9, wherein the electrically insulating body comprises at least one fastening at a lateral face of the support protruding into the mold body.

11. The power semiconductor device according to claim 1, wherein the mold body is made of at least one resin having, at a temperature of 297 K, a flexural modulus of between 5 GPa and 30 GPa inclusive.

12. The power semiconductor device according to claim 1, wherein the mold body comprises at least one filler which is an inorganic material and which is provided in a form of particles distributed in the mold body, wherein a mass fraction of the at least one filler on an overall mold body is between 30% and 70% inclusive.

13. The power semiconductor device according to claim 1, wherein the heat sink top side is in direct contact only with the at least one support and the mold body, and the heat sink is electrically insulated from the at least one power semiconductor chip.

14. The power semiconductor device according to claim 1, comprising a plurality of the supports, wherein all the supports are arranged distantly from one another on the heat sink top side and are located between the heat sink and the mold body.

15. The power semiconductor device of claim 1, wherein the power semiconductor device is manufactured by a process comprising:

A) providing the heat sink,

B) placing the at least one support directly on the heat sink top side,

C) pressing the at least one support onto the heat sink and at a same time forming the mold body onto the at least one support and onto the heat sink top side.

16. The power semiconductor device according to claim 1, wherein there is no intermediate layer between a support bottom side and the heat sink top side, and wherein the support bottom side is in direct physical contact with the heat sink top side without any thermal interface material, solder layer, or sinter layer therebetween.

17. The power semiconductor device according to claim 1, wherein at a temperature of 297 K, the at least one support is pressed onto the heat sink top side by the mold body with a mean pressure of at least 0.05 MPa and at most 5 MPa, wherein the mean pressure is averaged over the entire support bottom side.

18. The power semiconductor device according to claim 1, wherein there is no metallic connection and no electrically conductive connection between the support and the heat sink except through the support itself, and wherein the support and heat sink are not connected by solder, sinter layer, or conductive particles.

19. The power semiconductor device according to claim 1, wherein, seen in cross-section perpendicular to the support top side, a projection length of the mold body over the support top side, measured in parallel with the support top side, is at least 1 mm and at most 8 mm.

20. The power semiconductor device according to claim 1, wherein the mold body is formed by transfer molding or compression molding, and wherein during formation of the mold body, the at least one support is pressed onto the heat sink by a molding process.

* * * * *